(12) United States Patent
Liu et al.

(10) Patent No.: US 9,954,170 B2
(45) Date of Patent: Apr. 24, 2018

(54) RECESS STRUCTURE FOR PRINT DEPOSITION PROCESS AND MANUFACTURING METHOD THEREOF

(71) Applicant: Shenzhen China Star Optoelectronics Technology Co., Ltd., Shenzhen (CN)

(72) Inventors: Yawei Liu, Shenzhen (CN); Tsungyuan Wu, Shenzhen (CN)

(73) Assignee: SHENZHEN CHINA STAR OPTOELECTRONICS TECHNOLOGY CO., LTD., Shenzhen, Guangdong (CN)

(*) Notice: Subject to any disclaimer, the term of this patent is extended or adjusted under 35 U.S.C. 154(b) by 243 days.

(21) Appl. No.: 14/912,928

(22) PCT Filed: Jan. 29, 2016

(86) PCT No.: PCT/CN2016/072871
§ 371 (c)(1),
(2) Date: Feb. 19, 2016

(87) PCT Pub. No.: WO2017/096709
PCT Pub. Date: Jun. 15, 2017

(65) Prior Publication Data
US 2018/0033964 A1   Feb. 1, 2018

(30) Foreign Application Priority Data
Dec. 8, 2015   (CN) .......................... 2015 1 0898237

(51) Int. Cl.
*H01L 27/32*   (2006.01)
*H01L 51/00*   (2006.01)
(Continued)

(52) U.S. Cl.
CPC ........ *H01L 51/0004* (2013.01); *H01L 21/042* (2013.01); *H01L 27/32* (2013.01);
(Continued)

(58) Field of Classification Search
CPC ........................ H01L 27/3246; H01L 27/1292
See application file for complete search history.

(56) References Cited

U.S. PATENT DOCUMENTS

2005/0116620 A1* 6/2005 Kobayashi .......... H01L 51/5271
                                                    313/503
2010/0181559 A1* 7/2010 Nakatani ............. H01L 27/3246
                                                    257/40

FOREIGN PATENT DOCUMENTS

CN          101399283 A      4/2009

* cited by examiner

*Primary Examiner* — Thomas L Dickey
(74) *Attorney, Agent, or Firm* — Leong C. Lei

(57) ABSTRACT

The invention provides a recess structure for print deposition process and manufacturing method thereof. By disposing the dam (2) enclosing the recess (3) as comprising at least two stacked branch dam layers, and increasing the contact angle between the inclined inner circumferential surface of recess (3) enclosed by the branch dam layers and ink in a layer-by-layer manner, to limit height the ink able to climb on the inclined inner circumferential surface of the recess (3), the invention can improve the thickness uniformity of the organic functional layers printed in the recess and the photoelectric properties of organic functional layers. The recess (3) fabricated by the manufacturing method can limit height the ink able to climb on inclined inner circumferential surface of the recess (3) to improve the thickness uniformity of the organic functional layers printed in the recess and the photoelectric properties of organic functional layers.

3 Claims, 5 Drawing Sheets

(51) Int. Cl.
  *H01L 21/04* (2006.01)
  *H01L 51/52* (2006.01)
  *H01L 51/50* (2006.01)
  *H01L 51/56* (2006.01)
(52) U.S. Cl.
  CPC ...... *H01L 51/5056* (2013.01); *H01L 51/5072* (2013.01); *H01L 51/52* (2013.01); *H01L 51/56* (2013.01)

US 9,954,170 B2

RECESS STRUCTURE FOR PRINT DEPOSITION PROCESS AND MANUFACTURING METHOD THEREOF

BACKGROUND OF THE INVENTION

1. Field of the Invention

The present invention relates to the field of display, and in particular to a recess structure for print deposition process and manufacturing method thereof.

2. The Related Arts

The organic light emitting diode (OLED) display provides the advantages of self-luminous, low driving voltage, high luminous efficiency, short response time, high clarity and contrast, wide viewing angle of near-180°, wide operating temperature range, enabling flexible display and large full-color display and many other advantages, and is widely recognized as the most potential for the display device development.

OLED display generally comprises: a substrate, an anode disposed on the substrate, a cathode disposed on the anode, and an organic functional layer sandwiched between the anode and the cathode. Wherein the organic functional layer typically comprises a hole transport layer (HTL), an emissive layer (EML), and an electron transport layer (ETL). Each functional layer may be a layer, or more than one layer, e.g., the HTL may be further divided into a hole injection layer (HIL) and a hole transport layer; the ETL may be divided into an electron transport layer and an electron injection layer (EIL). The operating principle behind the OLED display is that the semiconductor materials and organic light emitting material, driven by the electric field, emit light through carrier injection and recombination.

The manufacturing method for OLED display typically starts with forming an anode on a substrate, then forming an HTL on the anode, followed by forming the EML on the HTL, and forming the ETL on the EML, and finally forming a cathode on the ETL, wherein the cathode and the anode are usually made of indium tin oxide (ITO). The functional layers (i.e., HTL, EML, and ETL) are fabricated in a vacuum thermal evaporation process or a solution process.

The so-called solution process is to treat the desired material, such as, dispersing into nano-scale particles and then dissolving in an appropriate solution, and then apply a film formation facility to deposit the solution on a substrate surface, a desired thin film is then formed on the substrate surface after solvent evaporation. Specific ways of film formation can be divided into the ink-jet printing, nozzle printing, roller printing, spin coating, and so on.

The substrate for print deposition process usually is disposed with a recess to restrict the ink. After drying by baking, the ink shrinks in the area restricted by the recess to form a thin film. Refer to FIG. 1, the recess 120 is formed by the enclosure of the dam 110 provided around the substrate 100 and the ITO anode 130. By depositing ink in the recess 120, the HIL 140, the HTL 150 and the EML 160 are formed. Refer to FIG. 2. An inclined angle α≤60° is typically set between the inner circumferential surface of the dam 110 and the upper surface of the substrate 100, and a contact angle θ≥45° is formed between the ink deposited in the recess 120 and the upper surface of the recess 120.

The contact angle between the ink and the inner circumferential inclined surface of the dam 110 has a great influence on the flatness of a film. Refer to FIG. 3. Because the different ink shows different hydrophilic property, ink with good hydrophilic property will climb higher along the inner circumferential inclined surface, resulting in a contact angle θ too small, which leads to poor thickness uniformity of the formed film. When applied in the organic functional layers in the print deposition OLED display, the poor thickness uniformity will cause the intermediate organic functional layer light first, which affects the display effect.

SUMMARY OF THE INVENTION

The object of the present invention is to provide a recess structure for print deposition process, able to improve the thickness uniformity of the organic functional layer printed in the recess and improve the photoelectrical property of the organic functional layers.

Another object of the present invention is to provide a manufacturing method of recess structure for print deposition process. The recess structure manufactured by the method can improve the thickness uniformity of the organic functional layer printed in the recess and improve the photoelectrical property of the organic functional layers.

To achieve the above object, the present invention provides a recess structure for print deposition process, the recess structure being disposed on the a substrate, which comprises a dam, and a recess enclosed by the dam; the dam at least comprising two stacked branch dam layers, the branch dam layer enclosing to form an inclined inner circumferential surface of the recess, and forming a contact angle with an ink increasing gradually from a lowermost branch dam layer to an uppermost branch dam layer in a layer-by-layer manner.

The recess structure is used for print deposition process for fabricating organic functional layers of an OLED display; the substrate is disposed with an anode, and the dam enclosing the recess is disposed on the edge of the circumference of the anode and on the substrate.

Optionally, the dam comprises a first branch dam layer disposed on the edge of the circumference of the anode and on the substrate, and a second branch dam layer stacked on top of the first branch dam layer.

The contact angle between the inclined inner circumferential surface of the recess enclosed by the first branch dam layer and ink is less than 10°, the contact angle between the inclined inner circumferential surface of the recess enclosed by the second branch dam layer and ink is greater than 20°, and the distance between the upper surface of the first branch dam layer and the upper surface of the anode is 50 nm-800 nm.

Optionally, the dam comprises a first branch dam layer disposed on the edge of the circumference of the anode and on the substrate, a second branch dam layer stacked on top of the first branch dam layer, and a third branch dam layer stacked on top of the second branch dam layer.

The contact angle between the inclined inner circumferential surface of the recess enclosed by the first branch dam layer and ink is less than 10°, the contact angle between the inclined inner circumferential surface of the recess enclosed by the second branch dam layer and ink is greater than 20° and less than 30°, the contact angle between the inclined inner circumferential surface of the recess enclosed by the third branch dam layer and ink is greater than 30° and less than 40°, and the distance between the upper surface of the first branch dam layer and the upper surface of the anode is 50 nm-800 nm.

The present invention also provides a manufacturing method of recess structure for print deposition process, which comprises: Step 1: providing a substrate and materials for at least two branch dam layers; and Step 2: using the materials for at least two branch dam layers to fabricate sequentially at least two stacked layers of branch dam layers on the substrate by coating, drying, and etching processes to form a dam, the dam enclosing to form a recess; a contact angle with an ink between an inclined inner circumferential surface of the recess formed by the enclosure of the branch dam layers increasing gradually from a lowermost branch dam layer to an uppermost branch dam layer in a layer-by-layer manner.

Optionally, in Step 1, an anode is disposed on the substrate, and Step 2 specifically comprises: Step 21: using a first material for branch dam layer to form a first branch dam layer at the edge of the circumference of the anode and on the substrate by coating, drying, and etching processes, the contact angle between the inclined inner circumferential surface of the recess enclosed by the first branch dam layer and ink being less than 10°, and the distance between the upper surface of the first branch dam layer and the upper surface of the anode is 50 nm-800 nm; Step 22: using a second material for branch dam layer to form a second branch dam layer on top of the first branch dam layer by coating, drying, and etching processes, the contact angle between the inclined inner circumferential surface of the recess enclosed by the second branch dam layer and ink being greater than 20°.

Optionally, in Step 1, an anode is disposed on the substrate, and Step 2 specifically comprises: Step 21: using a first material for branch dam layer to form a first branch dam layer at the edge of the circumference of the anode and on the substrate by coating, drying, and etching processes, the contact angle between the inclined inner circumferential surface of the recess enclosed by the first branch dam layer and ink being less than 10°, and the distance between the upper surface of the first branch dam layer and the upper surface of the anode is 50 nm-800 nm; Step 22: using a second material for branch dam layer to form a second branch dam layer on top of the first branch dam layer by coating, drying, and etching processes, the contact angle between the inclined inner circumferential surface of the recess enclosed by the second branch dam layer and ink being greater than 20° and less than 30°; Step 23: using a third material for branch dam layer to form a third branch dam layer on top of the second branch dam layer by coating, drying, and etching processes, the contact angle between the inclined inner circumferential surface of the recess enclosed by the third branch dam layer and ink being greater than 30° and less than 40°.

The at least two materials for branch dam layers provided in Step 1 have different hydrophilic property.

The present invention provides a recess structure for print deposition process, the recess structure being disposed on the a substrate, which comprises a dam, and a recess enclosed by the dam; the dam at least comprising two stacked branch dam layers, the branch dam layer enclosing to form an inclined inner circumferential surface of the recess, and forming a contact angle with an ink increasing gradually from a lowermost branch dam layer to an uppermost branch dam layer in a layer-by-layer manner; wherein the recess structure is used for print deposition process for fabricating organic functional layers of an OLED display; the substrate is disposed with an anode, and the dam enclosing the recess is disposed on the edge of the circumference of the anode and on the substrate; wherein the dam comprises a first branch dam layer disposed on the edge of the circumference of the anode and on the substrate, and a second branch dam layer stacked on top of the first branch dam layer; wherein the contact angle between the inclined inner circumferential surface of the recess enclosed by the first branch dam layer and ink is less than 10°, the contact angle between the inclined inner circumferential surface of the recess enclosed by the second branch dam layer and ink is greater than 20°, and the distance between the upper surface of the first branch dam layer and the upper surface of the anode is 50 nm-800 nm.

Compared to the known techniques, the present invention provides the following advantages: the present invention provides a recess structure for print deposition process and a manufacturing method thereof. By disposing the dam enclosing the recess as comprising at least two stacked layers of branch dam layers, and increasing the contact angle between the inclined inner circumferential surface of the recess enclosed by the branch dam layers and ink in a layer-by-layer manner, to limit height the ink able to climb on the inclined inner circumferential surface of the recess, the invention can improve the thickness uniformity of the organic functional layers printed in the recess and the photoelectric properties of organic functional layers. The present invention provides a manufacturing method of recess structure for print deposition process. A recess fabricated by the method can limit height the ink able to climb on the inclined inner circumferential surface of the recess, the invention can improve the thickness uniformity of the organic functional layers printed in the recess and the photoelectric properties of organic functional layers.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 1:
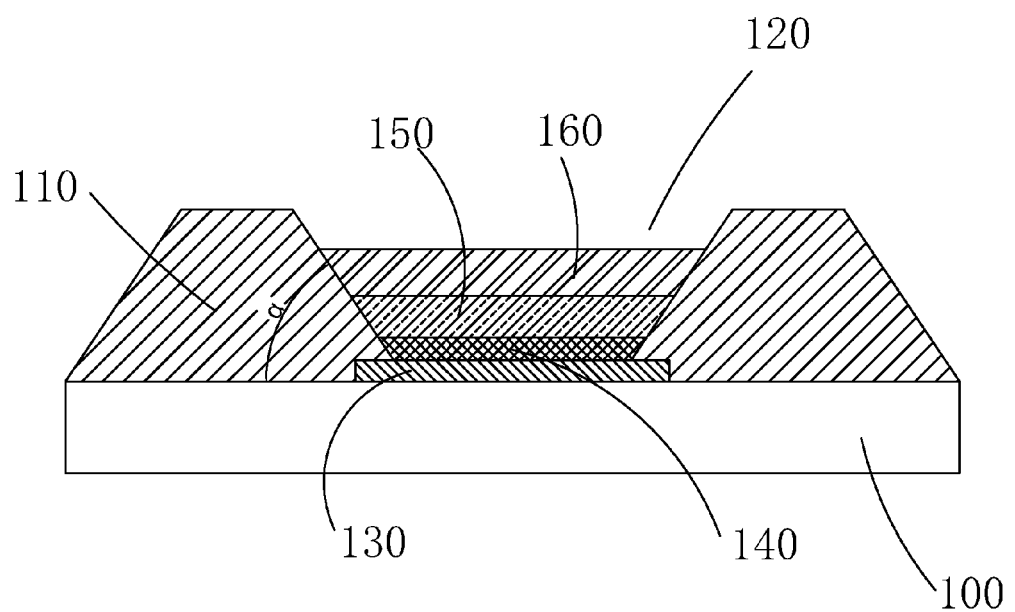
FIG. 1 is a schematic view showing the organic functional layers of a known OLED display fabricated a print deposition process.
Figure 2:
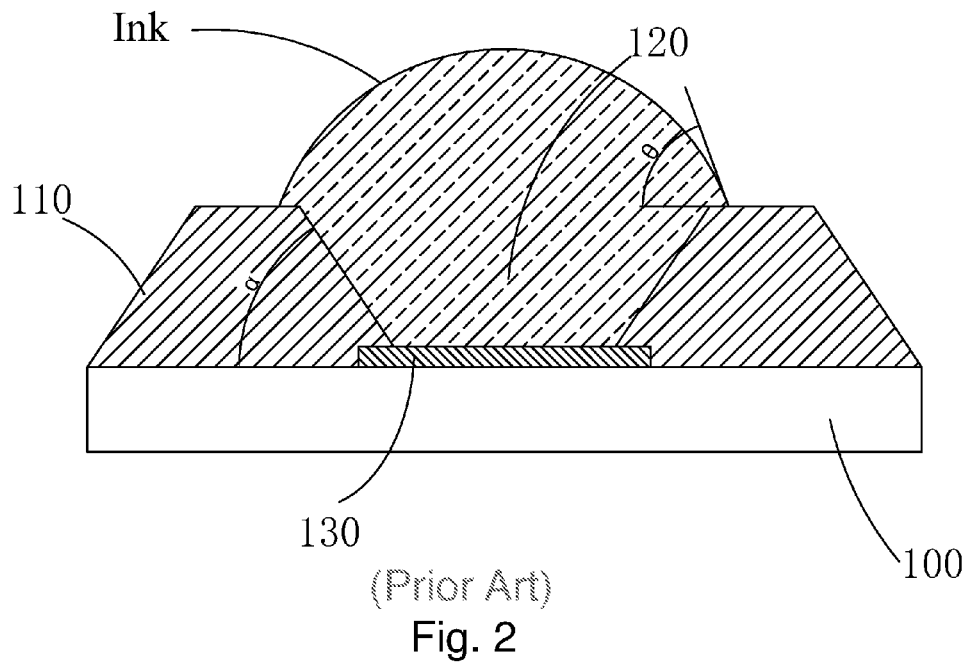
FIG. 2 is a schematic view showing the relation between the recess and ink in a know print deposition process.
Figure 3:
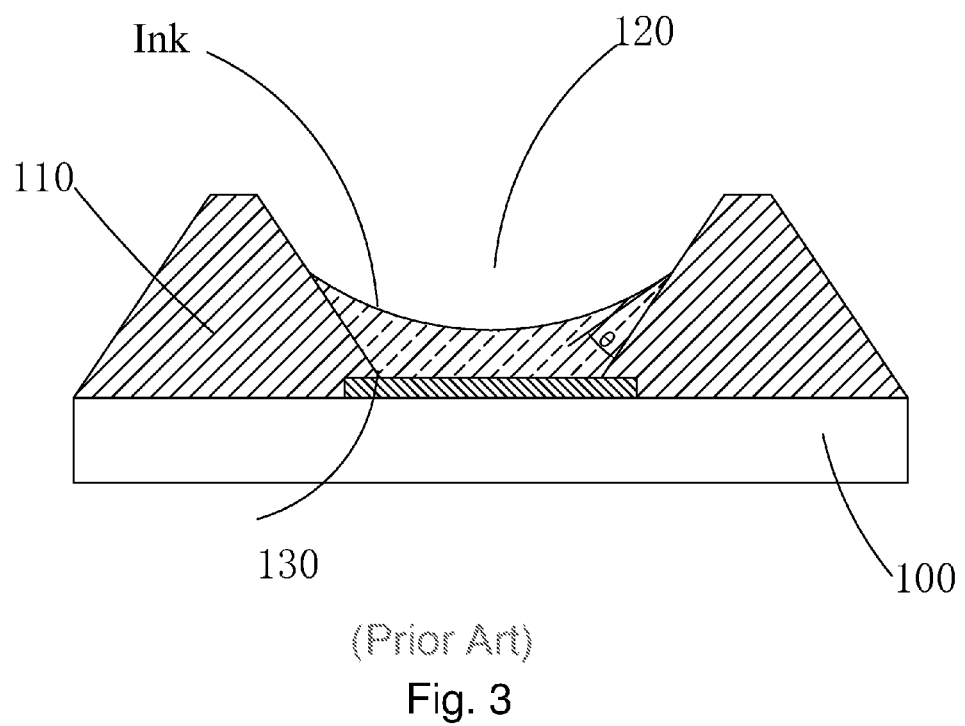
FIG. 3 is a schematic view showing the relation between the ink and the recess in a known print deposition process when the ink climbing too high on the declined inner circumferential surface of the dam enclosing the recess.
Figure 4:
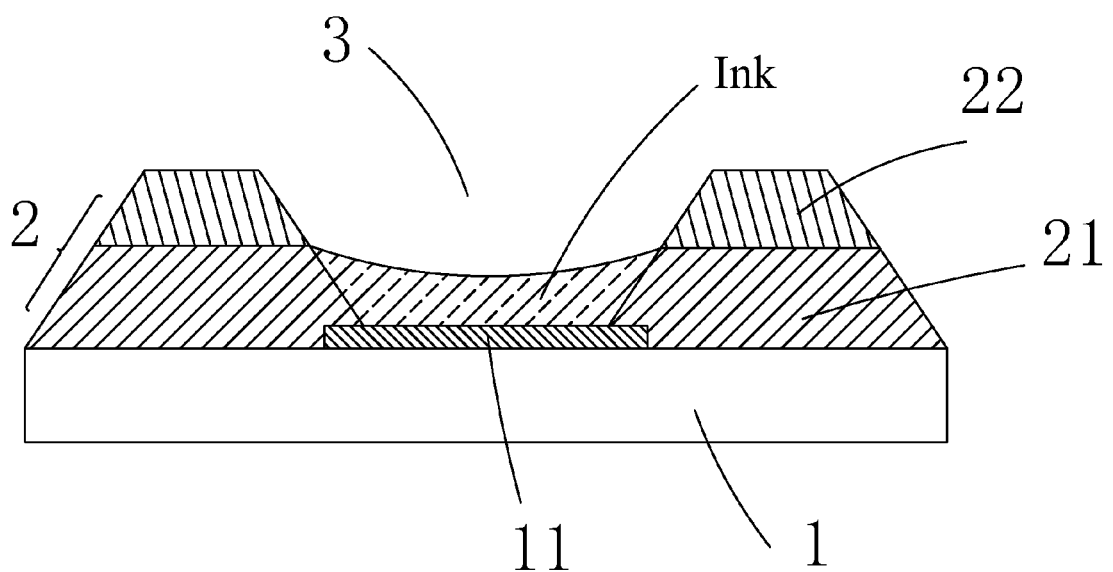
FIG. 4 is a schematic view showing recess structure for print deposition process provided by a first embodiment of the present invention.
Figure 5:
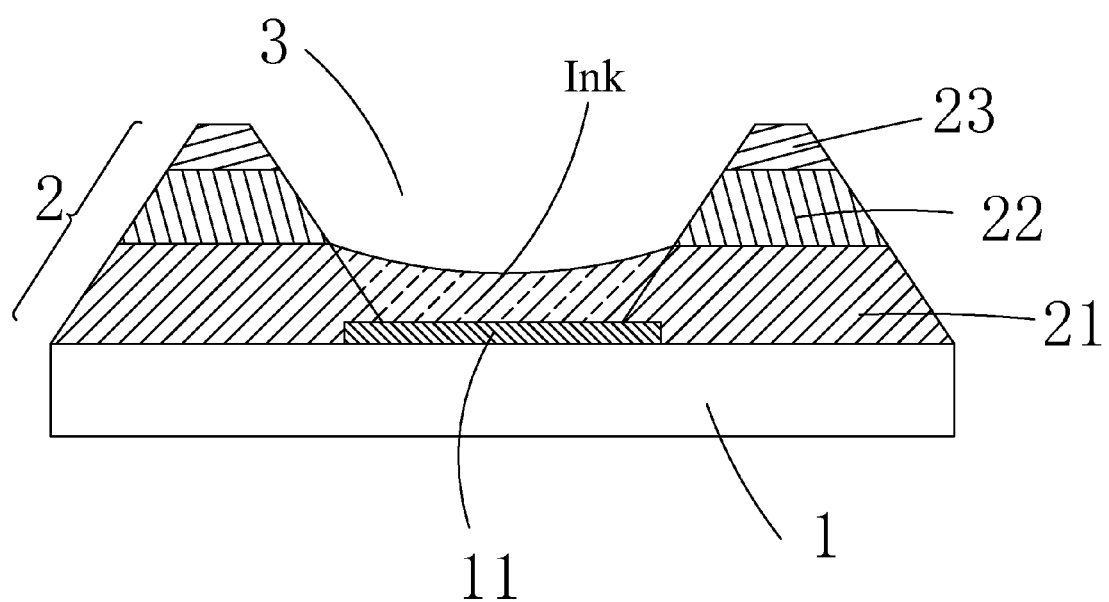
FIG. 5 is a schematic view showing recess structure for print deposition process provided by a second embodiment of the present invention.

Refer to FIGS. 4-5 for the first embodiment and the second embodiment of the recess structure for print deposition process provided by the present invention.

The recess structure is disposed on a substrate 1, which comprises: a dam 2, and a recess 3 enclosed by the dam 2.

The dam 2 at least comprises two stacked branch dam layers, the branch dam layer enclosing to form an inclined inner circumferential surface of the recess 3, and forming a contact angle with an ink increasing gradually from a lowermost branch dam layer to an uppermost branch dam layer in a layer-by-layer manner.

The at least two stacked branch dam layers are made of materials with different hydrophilic property so that the contact angle between the inclined inner circumferential surface of the recess 3 and the ink is different for each layer.

Moreover, the recess structure is used for print deposition process for fabricating organic functional layers of an OLED display; the substrate 1 is disposed with an anode 11, and the dam 2 enclosing the recess 3 is disposed on the edge of the circumference of the anode 11 and on the substrate 1. Preferably, the substrate 1 is a glass substrate, and the anode 11 is made ITO.

Specifically, refer to FIG. 4. In the first embodiment of the recess structure for print deposition process, dam comprises a first branch dam layer 21 disposed on the edge of the circumference of the anode 11 and on the substrate 1, and a second branch dam layer 22 stacked on top of the first branch dam layer 21.

Wherein the contact angle between the inclined inner circumferential surface of the recess 3 enclosed by the first branch dam layer 21 and ink is less than 10°, the contact angle between the inclined inner circumferential surface of the recess 3 enclosed by the second branch dam layer 22 and ink is greater than 20°, and the distance between the upper surface of the first branch dam layer 21 and the upper surface of the anode 11 is 50 nm-800 nm.

Specifically, by using the difference between the contact angles between the first branch dam layer 21 and the ink, and between the second branch dam layer 22 and the ink to limit height the ink able to climb on the inclined inner circumferential surface of the recess 3, the invention can improve the thickness uniformity of the organic functional layers printed in the recess and the photoelectric properties of organic functional layers as well as the display quality of the OLED display.

To further limit the climbing height of the ink on the inclined inner circumferential surface of the recess 3, refer to FIG. 5 for the second embodiment, wherein the dam 2 further comprises a third branch dam layer 23 stacked on top of the second branch dam layer 22.

Wherein the contact angle between the inclined inner circumferential surface of the recess enclosed by the second branch dam layer and ink is greater than 20° and less than 30°, and the contact angle between the inclined inner circumferential surface of the recess enclosed by the third branch dam layer and ink is greater than 30° and less than 40°.

The remaining is the same as the first embodiment and will not be repeated here.

Figure 6:
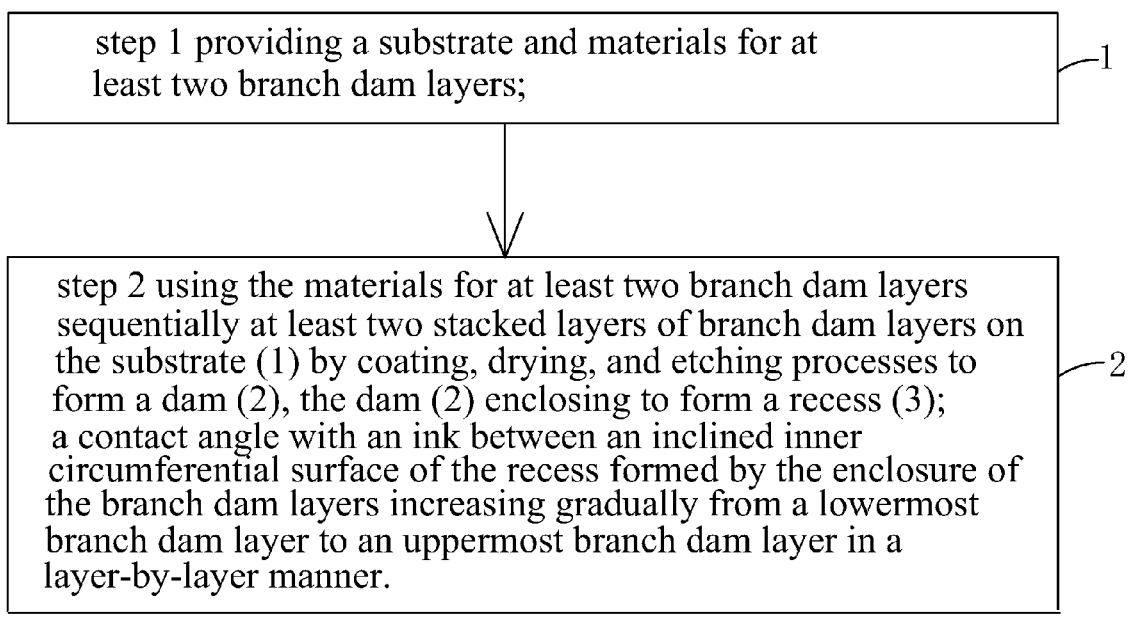
FIG. 6 is a schematic view showing the flowchart of the manufacturing method of recess for print deposition process provided by another embodiment of the present invention.

Refer to FIG. 6, in combination with FIGS. 4-5. The present invention also provides a manufacturing method of recess structure for print deposition process, which comprises:

Step 1: providing a substrate and materials for at least two branch dam layers.

Specifically, the at least two materials for branch dam layers provided in Step 1 have different hydrophilic property.

An anode 11 is disposed on the substrate 1. Preferably, the substrate 1 is a glass substrate, and the anode 11 is made of ITO.

Step 2: using the materials for at least two branch dam layers to fabricate sequentially at least two stacked layers of branch dam layers on the substrate 1 by coating, drying, and etching processes to form a dam 2, the dam 2 enclosing to form a recess 3; a contact angle with an ink between an inclined inner circumferential surface of the recess 3 formed by the enclosure of the branch dam layers increasing gradually from a lowermost branch dam layer to an uppermost branch dam layer in a layer-by-layer manner.

Optionally, to fabricate the recess 3 shown in FIG. 4, Step 2 specifically comprises:

Step 21: using a first material for branch dam layer to form a first branch dam layer 21 at the edge of the circumference of the anode 11 and on the substrate 1 by coating, drying, and etching processes, the contact angle between the inclined inner circumferential surface of the recess 3 enclosed by the first branch dam layer 21 and ink being less than 10°, and the distance between the upper surface of the first branch dam layer 21 and the upper surface of the anode 11 being 50 nm-800 nm.

Step 22: using a second material for branch dam layer to form a second branch dam layer 22 on top of the first branch dam layer 21 by coating, drying, and etching processes, the contact angle between the inclined inner circumferential surface of the recess 3 enclosed by the second branch dam layer 22 and ink being greater than 20°.

Optionally, to fabricate the recess 3 shown in FIG. 5, Step 2 specifically comprises:

Step 21: using a first material for branch dam layer to form a first branch dam layer 21 at the edge of the circumference of the anode 11 and on the substrate 1 by coating, drying, and etching processes, the contact angle between the inclined inner circumferential surface of the recess 3 enclosed by the first branch dam layer 21 and ink being less than 10°, and the distance between the upper surface of the first branch dam layer 21 and the upper surface of the anode 11 being 50 nm-800 nm.

Step 22: using a second material for branch dam layer to form a second branch dam layer 22 on top of the first branch dam layer 21 by coating, drying, and etching processes, the contact angle between the inclined inner circumferential surface of the recess 3 enclosed by the second branch dam layer 22 and ink being greater than 20° and less than 30°.

Step 23: using a third material for branch dam layer to form a third branch dam layer 23 on top of the second branch dam layer 22 by coating, drying, and etching processes, the contact angle between the inclined inner circumferential surface of the recess 3 enclosed by the third branch dam layer 23 and ink being greater than 30° and less than 40°.

The recess 3 obtained by the above manufacturing method, because the dam 2 enclosing the recess 3 comprises at least two stacked branch dam layers, and the contact angle between ink and the inclined inner circumferential surface of the recess 3 formed by the enclosure of the branch dam layers increases gradually from a lowermost branch dam layer to an uppermost branch dam layer in a layer-by-layer manner, by using the difference between the contact angles between the different branch dam layers, can limit height the ink able to climb on the inclined inner circumferential surface of the recess 3, the invention can improve the thickness uniformity of the organic functional layers printed in the recess and the photoelectric properties of organic functional layers as well as the display quality of the OLED display.

In summary, the present invention provides a recess structure for print deposition process and a manufacturing method thereof. By disposing the dam enclosing the recess as comprising at least two stacked layers of branch dam layers, and increasing the contact angle between the inclined inner circumferential surface of the recess enclosed by the branch dam layers and ink in a layer-by-layer manner, to limit height the ink able to climb on the inclined inner circumferential surface of the recess, the invention can improve the thickness uniformity of the organic functional layers printed in the recess and the photoelectric properties of organic functional layers. The present invention provides a manufacturing method of recess structure for print deposition process. A recess fabricated by the method can limit height the ink able to climb on the inclined inner circumferential surface of the recess, the invention can improve the thickness uniformity of the organic functional layers printed in the recess and the photoelectric properties of organic functional layers.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A recess structure for print deposition process, the recess structure being disposed on the a substrate, which comprises a dam, and a recess enclosed by the dam;

the dam at least comprising two stacked branch dam layers, the branch dam layer enclosing to form an inclined inner circumferential surface of the recess, and forming a contact angle with an ink increasing gradually from a lowermost branch dam layer to an uppermost branch dam layer in a layer-by-layer manner;

wherein the recess structure is used for print deposition process for fabricating organic functional layers of an organic light-emitting diode (OLED) display; the substrate is disposed with an anode, and the dam enclosing the recess is disposed on the edge of the circumference of the anode and on the substrate;

wherein the dam comprises a first branch dam layer disposed on the edge of the circumference of the anode and on the substrate, a second branch dam layer stacked on top of the first branch dam layer, and a third branch dam layer stacked on top of the second branch dam layer; and wherein the contact angle between the inclined inner circumferential surface of the recess enclosed by the first branch dam layer and ink is less than 10°, the contact angle between the inclined inner circumferential surface of the recess enclosed by the second branch dam layer and ink is greater than 20° and less than 30°, the contact angle between the inclined inner circumferential surface of the recess enclosed by the third branch dam layer and ink is greater than 30° and less than 40°, and the distance between the upper surface of the first branch dam layer and the upper surface of the anode is 50 nm-800 nm.

2. A manufacturing method of recess structure for print deposition process, which comprises:

Step 1: providing a substrate and materials for at least two branch dam layers; and Step 2: using the materials for at least two branch dam layers to fabricate sequentially at least two stacked layers of branch dam layers on the substrate by coating, drying, and etching processes to form a dam, the dam enclosing to form a recess;

a contact angle with an ink between an inclined inner circumferential surface of the recess formed by the enclosure of the branch dam layers increasing gradually from a lowermost branch dam layer to an uppermost branch dam layer in a layer-by-layer manner;

wherein in Step 1, an anode is disposed on the substrate, and Step 2 specifically comprises:

Step 21: using a first material for branch dam layer to form a first branch dam layer at the edge of the circumference of the anode and on the substrate by coating, drying, and etching processes;

the contact angle between the inclined inner circumferential surface of the recess enclosed by the first branch dam layer and ink being less than 10°, and the distance between the upper surface of the first branch dam layer and the upper surface of the anode is 50 nm-800 nm;

Step 22: using a second material for branch dam layer to form a second branch dam layer on top of the first branch dam layer by coating, drying, and etching processes;

the contact angle between the inclined inner circumferential surface of the recess enclosed by the second branch dam layer and ink being greater than 20° and less than 30°;

Step 23: using a third material for branch dam layer to form a third branch dam layer on top of the second branch dam layer by coating, drying, and etching processes;

the contact angle between the inclined inner circumferential surface of the recess enclosed by the third branch dam layer and ink being greater than 30° and less than 40°.

3. The manufacturing method as claimed in claim 2, wherein the at least two materials for branch dam layers provided in Step 1 have different hydrophilic property.

* * * * *